United States Patent [19]

Henry

[11] 4,107,668
[45] Aug. 15, 1978

[54] HIGH-SPEED ANALOG-TO-DIGITAL CONVERTER

[75] Inventor: Paul Shala Henry, Holmdel, N.J.

[73] Assignee: Bell Telephone Laboratories, Incorporated, Murray Hill, N.J.

[21] Appl. No.: 815,820

[22] Filed: Jul. 15, 1977

[51] Int. Cl.² .......................................... H03K 13/02
[52] U.S. Cl. ........................... 340/347 AD; 324/83 D
[58] Field of Search ... 340/347 M, 347 DD, 347 AD; 324/83 D

[56] References Cited

U.S. PATENT DOCUMENTS

| | | | |
|---|---|---|---|
| 3,068,456 | 12/1962 | Nevius | 340/347 M |
| 3,343,157 | 9/1967 | Carre | 340/347 M |
| 3,624,641 | 11/1971 | Brennan | 340/347 M |
| 3,745,559 | 7/1973 | Mattern | 340/347 M |
| 3,761,916 | 9/1973 | Schenck | 340/347 M |

*Primary Examiner*—Charles D. Miller
*Attorney, Agent, or Firm*—Erwin W. Pfeifle

[57] ABSTRACT

A high speed apparatus for converting an analog signal to a digital signal is disclosed. The analog-to-digital converter phase modulates a predetermined carrier signal with the analog signal and this phase modulated signal is transmitted along separate parallel paths to a first and a second phase detector where the phase relationship between the phase modulated signal and each of a first and a second sample, respectively, of the carrier signal which differ in phase by substantially 90 degrees from each other is detected. The output signal of each detector is compared with a reference potential to generate a zero or a one dependent on the magnitude of the detector output relative to the reference potential. Subsequent bits of the digital output signal can be generated by frequency doubling both the phase modulated signal and the carrier signal as applied to the previous parallel path for conversion in a separate corresponding parallel path.

4 Claims, 4 Drawing Figures

HIGH-SPEED ANALOG-TO-DIGITAL CONVERTER

BACKGROUND OF THE INVENTION

1. Field of the Invention

The present invention relates to a very fast analog-to-digital (A/D) converter and, more particularly, to a very fast A/D converter which first converts the input analog waveform into a phase-modulated signal and then uses broadband circuitry to achieve fast word-at-a-time digital encoding of the phase-modulated signal.

2. Description of the Prior Art

Analog-to-digital (A/D) converters are well known in the art, and are used to convert an analog input signal, which may be a voltage or a current signal, into an equivalent digital output signal. In this regard see, for example, U.S. Pat. Nos. 3,611,350 issued to L. M. Leibowitz on Oct. 5, 1971 and 3,701,144 issued to D. E. Fineran et al on Oct. 24, 1972. Although such A/D converters are at times designated high speed, they are limited in speed of operation to well below a 10 MHz sampling rate generally as a result of delays in the encoder logic used. Additionally, such prior art A/D converters are generally relatively complex and usually require a large number of elements.

To simplify the A/D converter circuitry and to permit an increase in the speed of operation, analog-to-Gray code converters have been devised. In this regard, see, for example, U.S. Pat. Nos. 3,587,089 issued to N. P. Elliott on June 22, 1971 and 3,829,853 issued to D. D. Freedman on Aug. 13, 1974. These arrangements have increased the speed of operation up to near the 10 MHz sampling rate. Although A/D converters having sampling rates which are much greater than 10 MHz have been devised, such A/D converters are extremely complex and are limited to a very few bits.

The problem remaining in the prior art, however, is to provide a relatively uncomplicated and economical A/D converter capable of converting an analog signal into a corresponding digital output signal at, for example, a sampling rate above 100 MHz.

SUMMARY OF THE INVENTION

The present invention relates to a very fast A/D converter and, more particularly, to a very fast A/D converter which first converts the input analog waveform into a phase-modulated signal and then uses broadband circuitry to achieve fast word-at-a-time digital encoding of the phase-modulated signal.

It is another aspect of the present invention to provide a very fast A/D converter which phase-modulates a predetermined carrier signal with the incoming analog signal and transmits the resultant phase-modulated signal along separate parallel paths to a first and a second phase detector where the phase relationship between the phase-modulated signal and each of a first and a second sample, respectively, of the carrier signal which differ in phase by substantially 90 degrees is detected. The output of each detector is compared with a reference potential, preferably ground potential, to generate representative corresponding bits of the digital output signal. Subsequent bits of the representative digital output signal are generated by frequency doubling both the phase-modulated signal and the carrier signal as applied to the previous parallel path for conversion in a separate corresponding parallel path.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views.

DETAILED DESCRIPTION

Figure 1:
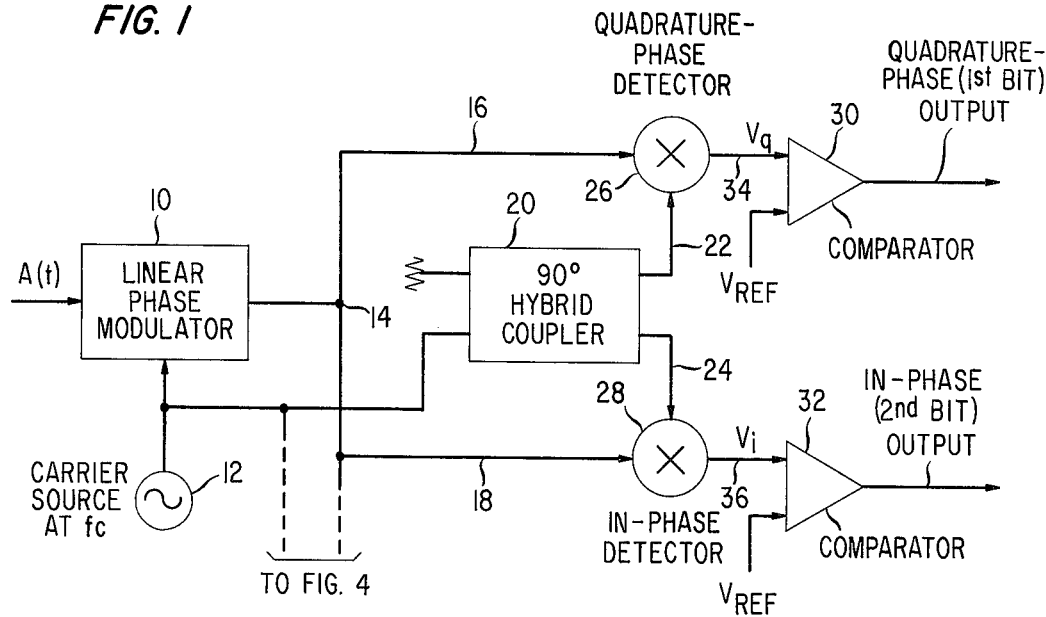
FIG. 1 is a simplified block circuit diagram of a two-bit analog-to-digital converter in accordance with the present invention.

The principle of the present analog-to-digital (A/D) converter is shown in FIG. 1 where a two-bit converter is illustrated which is capable of very high speed operation since most of the signal processing is performed using wideband analog circuitry and digital processing is kept to a minimum. The analog signal, A(t), to be digitized by the present converter is assumed to be confined to a known frequency range as given by $$-A_o < A(t) < A_o. \tag{1}$$

The analog input signal, A(t), is applied to a linear phase modulator 10 in conjunction with a carrier signal, $f_c$, from a carrier source 12 having a frequency which is greater than the highest frequency of the analog signal. The output signal of phase modulator 10 can be expressed as $$V(t) = B \cos(2\pi f_c t + \pi \frac{A(t)}{A_o}), \tag{2}$$

where B is a constant. Linear phase modulator 10 can comprise any suitable arrangement such as, for example, the linear phase modulator described in the article, "A Linear Phase Modulator for a Short-Hop Microwave Radio System", by S. R. Shah in *Bell System Technical Journal*, Vol. 51, October 1972 at pp. 1837–1848. It is to be understood, however, that the use of a linear phase modulator will produce a linear binary representation of the analog input signal at the output of the present A/D converter and that such use in the present A/D converter description is exemplary only and is for purposes of exposition and not for purposes of limitation. It will be readily appreciated that where a nonlinear binary representation, such as, for example, a log function, of the analog input signal is desired, a nonlinear phase modulator would be used in place of linear phase modulator 10.

The output signal, V(t), from linear phase modulator 10 is divided using, for example, a junction 14 and each portion of the divided signal is propagated in a separate parallel path 16 and 18. The carrier signal, $f_c$, from source 12 is also applied to a 90° hybrid coupler 20 which provides, for example, a quadrature component of the carrier signal on an output lead 22 thereof and an in-phase component of the carrier signal on an output lead 24 thereof. Coupler 20 can comprise any suitable form capable of providing the quadrature carrier signal components just mentioned.

The portion of the output signal from linear phase modulator 10 propagating along path 16 is applied to a phase detector 26 in conjunction with the quadrature component of the carrier signal found on lead 22 which is used as a reference source. The detected output signal from phase detector 26 is given by $$V_q(t) = +C \sin \pi A(t)/A_o. \quad (3)$$

Similarly, the portion of the output signal from linear phase modulator 10 propagating along path 18 is applied to a phase detector 28 in conjunction with the in-phase component of the carrier signal found on lead 24 which is used as a reference source. The detected output signal from phase detector 28 is given by $$V_i(t) = -C \cos \pi A(t)/A_o, \quad (4)$$

where in Equations (3) and (4) C is a constant and the subscripts $q$ and $i$ refer to the exemplary quadrature-phase and in-phase detectors 26 and 28, respectively. It is to be understood that the assignment of signs in Equations (3) and (4) is arbitrary, and the choice shown hereinabove yields a commonly-used form of Gray code as will be discussed hereinafter.

The signals $V_q$ and $V_i$ from phase detectors 26 and 28 are applied to comparators 30 and 32, respectively, via respective leads 34 and 36. For exemplary purposes only, it is hereinafter assumed that the output from each of comparators 30 and 32 will be a +1 when the input signal is positive and a 0 when the input signal is negative. The resulting outputs from comparators 30 and 32, as a function of $A(t)$, are shown in Table 1 below and also in FIG. 2 where the shaded regions denote a +1 output.

TABLE I

| Analog Input | Quadrature-Phase Component | In-Phase Component |
|---|---|---|
| $-A_o < A(t) < -A_o/2$ | 0 | 1 |
| $-A_o/2 < A(t) < 0$ | 0 | 0 |
| $0 < A(t) < A_o/2$ | 1 | 0 |
| $A_o/2 < A(t) < A_o$ | 1 | 1 |

The comparator outputs are seen to constitute a two-bit representation of input analog signal $A(t)$.

Figure 3:
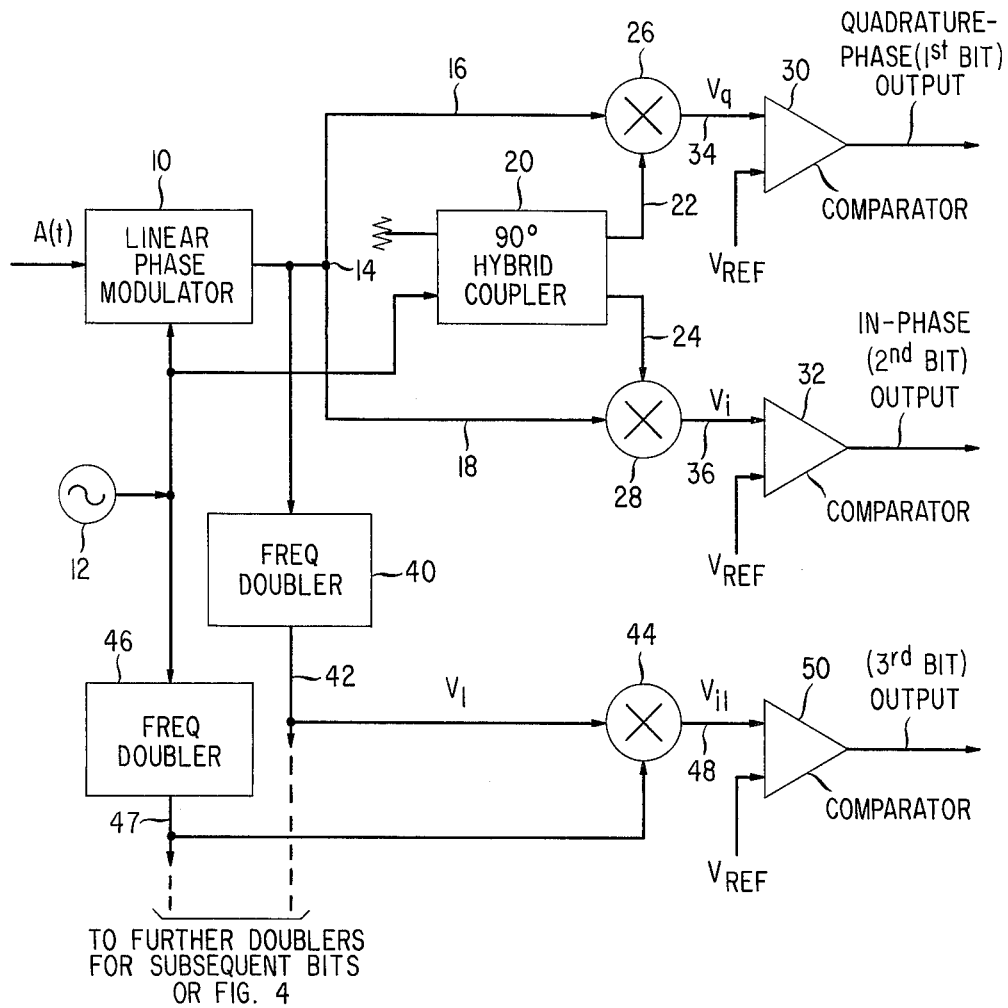
FIG. 3 is a simplified block circuit diagram of a three or more bit analog-to-digital converter in accordance with the present invention.

To increase the number of bits used to digitize the analog input signal $A(t)$, a three-bit A/D converter shown in FIG. 3 can be used which is an extension of the arrangement of FIG. 1. In FIG. 3 the signal from linear phase modulator 10 is frequency-doubled in doubler 40, giving an output on lead 42 of $$V_1(t) = B \cos (4\pi f_c t + 2\pi A(t)/A_o). \quad (5)$$

$V_1(t)$ is phase-detected in phase detector 44 using the carrier signal, $f_c$, which has been frequency-doubled in doubler 46 and available on lead 47 as a reference signal. The output signal from detector 44 on lead 48 is given by $$V_{i1}(t) = C \cos 2\pi A(t)/A_o, \quad (6)$$

and is applied as an input signal to comparator 50 which functions in a manner corresponding to comparators 30 and 32 described hereinbefore. The output from comparator 50 is, therefore, a +1 when $2\pi A(t)/A_o$ is in the first and fourth quadrants, and 0 otherwise. The output from comparator 50 is the third bit in the digitization of $A(t)$ and is also shown in FIG. 2.

Figure 2:
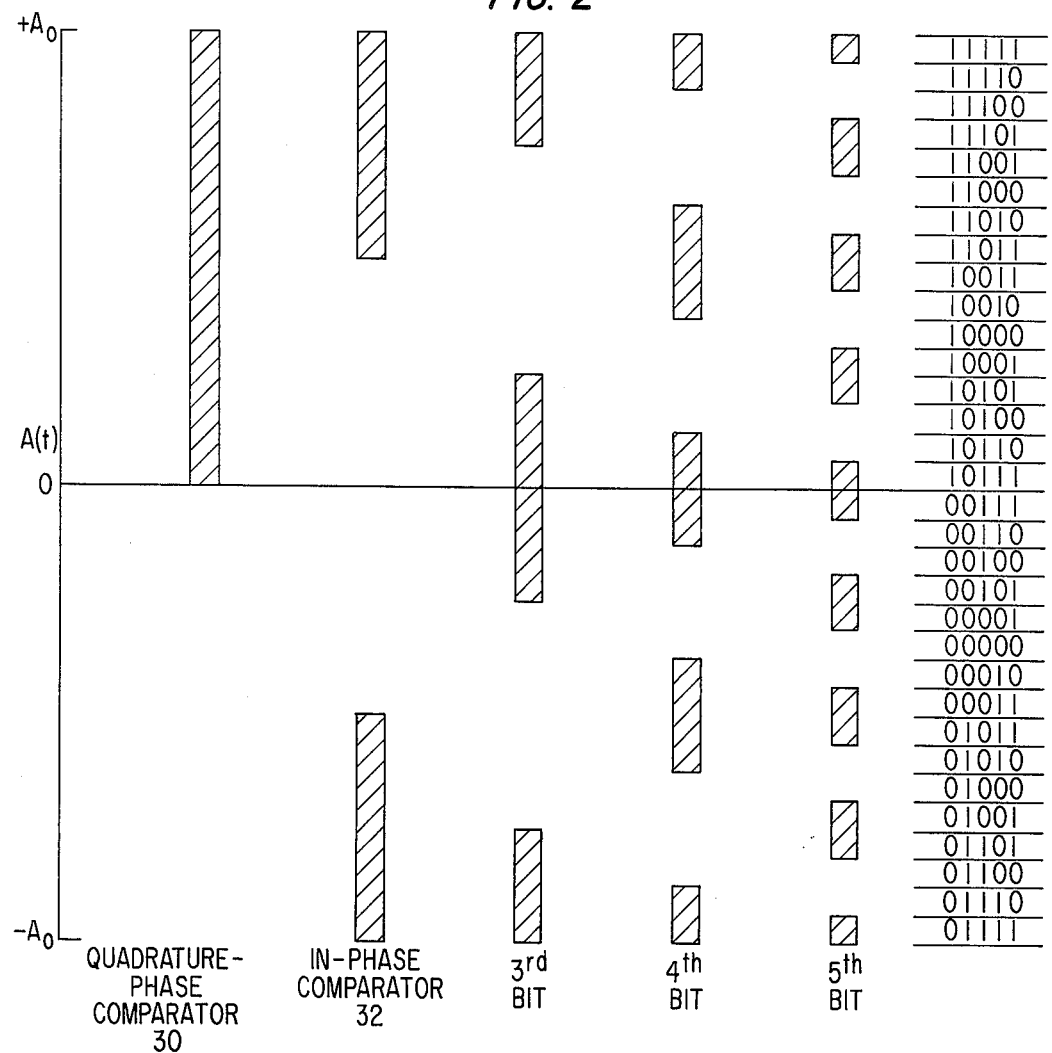
FIG. 2 is a graphical representation of the output levels for up to a five-bit analog-to-digital converter in accordance with the present invention.

Succeeding bits in the digitization of $A(t)$ can be generated in a fashion similar to the generation of the third bit in FIG. 3 by further frequency-doublings of the phase-modulated signal on lead 42 and the carrier signal on lead 47 and phase detection of each of the subsequently doubled signals in a separate phase detector. After M doublings it is found that the associated comparator output signal is positive when $$\cos (2^M \pi A(t)/A_o) > 0 \quad (7)$$

as shown in FIG. 2 for M $\leq$ 3.

The output of the present A/D is a plurality of bits forming a binary word as represented by all of the comparator outputs, and is shown in the right-hand column of FIG. 2 for a five-bit A/D converter. The symmetry of the code about the central level ($A(t) = 0$), except for the first or left-hand bit, and the fact that adjacent levels differ by only one bit, means that this is a reflected-binary or Gray code representation. The Gray code output of the present A/D converter can be decoded to the conventional binary code where desired by any suitable arrangement as is well known to persons skilled in the art.

Figure 4:
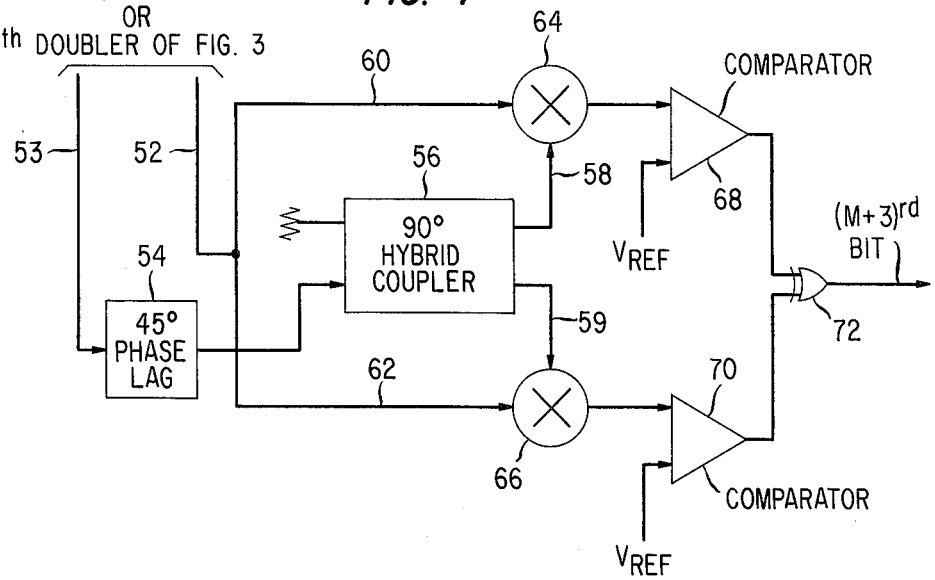
FIG. 4 is a simplified block circuit diagram of an arrangement for generating an additional bit in the A/D converter of FIGS. 1 and 3.

From the description hereinbefore, it has been shown that the present A/D converter generates M + 2 bits after M frequency doublings of both the phase-modulated input signal and the carrier signal. As shown in FIG. 4, it is possible to obtain one extra bit without further doubling by the use of additional circuit components. The arrangement of FIG. 4 can be used to obtain the third bit when used with the arrangement of FIG. 1 or the fourth or larger bit when used with the arrangement of FIG. 3. For purposes of exposition only, the discussion presented hereinafter will only describe the arrangement of FIG. 4 as used with the arrangement of FIG. 3, and a person skilled in the art can easily relate this discussion to the combined arrangments of FIGS. 1 and 4.

The phase-modulated signal after M doublings and available on line 52 is given by the expression $$V_M(t) = B \cos \left[ 2^M(2\pi f_c t + \pi \frac{A(t)}{A_o}) \right]. \quad (8)$$

The carrier signal after M doublings is available on lead 53 and is applied to circuit 54 which introduces a 45° phase lag and produces an output signal represented by $$V_c(t) = B \cos (2^M \cdot 2\pi f_c t - \frac{\pi}{4}). \quad (9)$$

The output signal from circuit 54 is applied to a 90° hybrid coupler 56 which provides a quadrature component and an in-phase component of the signal of Equation (9) on leads 58 and 59, respectively. The phase-modulated signal on lead 52 is divided by any suitable means with each divided portion being applied to a separate parallel path 60 and 62. The signals on parallel path 60 and on lead 58 are applied as inputs to a phase detector 64 which produces the quadrature output signal given by the expression $$V_{qM}(t) = C \sin (2^M \cdot \pi \frac{A(t)}{A_o} + \frac{\pi}{4}). \quad (10)$$

The signals on parallel path 62 and on lead 59 are applied as inputs to a phase detector 66 which produces the in-phase output signal given by the expression $$V_{IM}(t) = C \cos (2^M \cdot \pi \frac{A(t)}{A_o} + \frac{\pi}{4}). \quad (11)$$

The signals $V_{qM}$ and $V_{IM}$ are each compared in comparators 68 and 70, respectively, to a reference voltage, which is preferably ground potential but corresponds to the reference voltage used by comparators 30, 32 and 50 of FIGS. 1 and 3, to generate, for example, a "+1" when the input signal, $V_{qM}$ or $V_{IM}$, is above the reference voltage or a "0" when the input signal is below the reference voltage. The outputs from comparators 68 and 70 are applied as separate inputs to an Exclusive-OR gate 72 to produce a final output which is positive when $$\tan (2^M \pi \frac{A(t)}{A_o} + \frac{\pi}{4}) > 0 \quad (12)$$

which condition is equivalent to $$\cos (2^{M+1} \pi \frac{A(t)}{A_o}) > 0. \quad (13)$$

In comparing Equations (7) and (13), it is evident that the output of the Exclusive-OR gate 72 of FIG. 4 produces the same output after M doublings, where $M \geq 0$, as the conventional phase-detection circuit after M + 1 doublings.

The principal limitation on the speed of the present A/D converter is the nonavailability frequency-multiplication and phase-detection components operable at very high frequencies which, for purposes of illustration, will be considered above 18 GHz. A maximum frequency constraint of this nature imposes an upper limit on the bandwidth of the analog signal that can be handled by an A/D converter with a resolution of a given number of bits. In the present A/D converter, an N-bit converter requires as a minimum N-3 doublings and, therefore, the carrier frequency at phase modulator 10 must satisfy the expression $$f_c \leq 18 \text{ GHz}/2^{N-3}. \quad (14)$$

In order for phase modulator 10 to function properly, the highest modulating frequency, $f_{max}$, must be substantially less than $f_c$. If it is required that, for example, $$f_{max} \leq f_c/10 \quad (15)$$

then it becomes clear that $$f_{max} \leq 18 \text{GHz}/10 \cdot 2^{N-3} \quad (16)$$

and the spectrum to be digitized by, for example, an eight-bit A/D converter cannot be wider than 56 MHz.

According to the Nyquist Sampling Theorem, the outputs of the A/D converter comparators 30, 32, 50, 68 and 70 should be sampled or "strobed" at a rate of $2f_{max}$. Using the eight-bit example cited hereinabove, a sampling rate of 112 MHz is derived. The resultant A/D converter output of, for example 8 bits × 112 MHz represents a vast improvement over currently available A/D converters.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. An additional bit generator for use in an analog-to-digital converter arrangement which converts an analog input signal to a multibit digital output signal, the arrangement comprising a phase modulator capable of generating a phase-modulated output signal derived from the modulation, by the analog input signal, of a carrier signal having a frequency which is higher than the highest frequency included in the analog input signal, and means for generating a first and a second bit of the converter multibit digital output signal from the phase relationship between the fundamental harmonic of the phase-modulated output signal and each of a quadrature and in-phase sample of the fundamental harmonic of the carrier signal; the additional bit generator comprising means for both introducing a 45° phase lag in the carrier signal and generating an output signal representative of the phase lagged signal;

second means for generating a first and a second sample of said phase lag introduction means output signal which samples differ in phase by substantially 90° from each other;

a first and a second phase detector for determining the phase relationship between the output signal from said linear phase modulator and said first and second samples of said phase lag introduction means, respectively;

a first and a second comparator coupled to the output of said first and second phase detector, respectively, and to a predetermined reference potential for comparing the output signal from the associated phase detector with said reference potential, each comparator generating an output signal having a first binary value when the magnitude of the associated phase detector output signal is greater than said reference potential and a second binary value when the magnitude of the associated phase detector output signal is less than said reference potential; and third means for generating an output signal representative of the Exclusive-OR function of the combined output signals from said first and second comparators, said output signal corresponding to the additional bit in the converter multibit digital output signal.

2. An additional bit generator for use in an analog-to-digital converter arrangement which converts an analog input signal to a multibit digital output signal, the arrangement comprising (a) a phase modulator capable of generating a phase-modulated output signal derived from the modulation, by the analog input signal, of a carrier signal having a frequency which is higher than the highest frequency included in the analog input signal, (b) first means for generating a first and a second bit from the phase relationship between the fundamental harmonic of the phase-modulated output signal and each of a quadrature and in-phase sample of the fundamental harmonic of the carrier signal; and (c) second means for concurrently generating each subsequent bit of the converter multibit digital output signal from the phase relationship between a frequency doubled value of each of the phase-modulated signal and the carrier signal used for generating the immediately previous bit of the converter multibit digital output signal, the additional bit generator comprising means for both introducing substantially a 45° phase lag in said frequency doubled carrier signal used for generating the immediately previous bit in the converter multibit digital output signal and generating an output signal representative of the phase lagged signal;

second means for generating a first and a second sample of said phase lag introduction means output signal which samples differ in phase by substantially 90° from each other;

a first and a second phase detector for determining the phase relationship between said frequency doubled phase-modulated output signal used for generating the immediately previous bit in said converter multibit digital output signal and said first and second samples of said phase lag introduction means, respectively;

a first and a second comparator coupled to the output of said first and second phase detector, respectively, and to a source of a predetermined reference potential for comparing the output signal from the associated phase detector with said reference potential, each comparator generating an output signal having a first binary value when the magnitude of the associated phase detector output signal is greater than said reference potential and a second binary value when the magnitude of the associated phase detector output signal is less than said reference potential; and means for generating an output signal representative of the Exclusive-OR function of the combined output signal from said first and second comparators, said output signal corresponding to the additional bit in said converter multibit digital output signal.

3. A method of converting an analog input signal to a multibit digital output signal comprising the steps of:

(a) phase-modulating a predetermined carrier signal with the analog signal to generate a phase-modulated output signal;

(b) generating a first and a second sample of said predetermined carrier signal which differ in phase by substantially 90° from each other;

(c) detecting the phase relationship between each of the first and second samples of said predetermined carrier signal and said phase-modulated output signal to generate a first and a second phase-detected output signal, respectively;

(d) comparing each of said first and second phase-detected output signals with a predetermined reference potential and generating a first and a second digital output signal representative of the first and second bits of the converted multibit digital output signal each having a first binary value when the magnitude of the associated phase-detected output signal is greater than the reference potential and a second binary value when the magnitude of the associated phase-detected output signal is less than said reference potential;

(e) concurrent with step (b) introducing substantially a 45° phase lag in said carrier signal and generating an output signal representative of the phase-lagged signal;

(f) generating a first and a second sample of said phase-lagged output signal generated in step (e) which differ in phase by substantially 90° from each other;

(g) detecting the phase relationship between each of the first and second samples of said phase-lagged output signal generated in step (f) and said phase-modulated output signal for generating a third and a fourth phase-detected output signal, respectively;

(h) comparing each of said third and fourth phase-detected output signals with said predetermined reference potential and generating a third and a fourth digital output signal each having a first binary value when the associated phase-detected output signal is greater than the reference potential and a second binary value when the magnitude of the associated phase-detected output signal is less than said reference potential; and (i) generating a fifth digital output signal representative of the Exclusive-OR function of the third and fourth digital output signals, said fifth digital output signal being representative of the third bit in the converted multibit digital output signal.

4. A method of converting an analog input signal to a multibit digital output signal comprising the steps of:

(a) phase-modulating a predetermined carrier signal with the analog signal to generate a phase-modulated output signal;

(b) generating a first and a second sample of said predetermined carrier signal which differ in phase by substantially 90° from each other;

(c) detecting the phase relationship between each of the first and second samples of said predetermined carrier signal and said phase-modulated output signal to generate a first and a second phase-detected output signal, respectively;

(d) comparing each of said first and second phase-detected output signals with a predetermined reference potential and generating a first and a second digital output signal representative of the first and second bits in the converted multibit digital output signal each having a first binary value when the magnitude of the associated phase-detected output signal is greater than the reference potential and a second binary value when the magnitude of the associated phase-detected output signal is less than said reference potential;

(e) concurrent with step (b) generating a separate set of second input signals for each subsequent bit of the converted digital output signal to be generated, each of said set of second input signals comprising a frequency doubled value of each of said phase-modulated output signal and said carrier signal as used for generating the immediately previous bit of the converted multibit digital output signal;

(f) detecting the phase relationship between each of the associated frequency doubled phase-modulated output signals and frequency doubled carrier signals and generating a third phase-detected output signal representative thereof;

(g) comparing each of said third phase-detected output signals with said predetermined reference potential and generating a separate digital output signal representative of the next subsequent bit in the converted multibit digital output signal having a first binary value when the magnitude of the associated third phase-detected output signal is greater than the reference potential and a second binary value when the magnitude of the third phase-detected output signal is less than said reference potential;

(h) concurrent with step (e) introducing substantially a 45° phase lag in said frequency doubled carrier signal used for generating the immediately previous bit in the converted multibit digital output signal and generating an output signal representative of the phase-lagged signal;

(i) generating a first and a second sample of said phase-lagged output signal generated in step (h) which differ in phase by substantially 90° with each other;

(j) detecting the phase relationship between each of the first and second samples of said phase-lagged output signal generated in step (i) and said frequency doubled phase-modulated output signal used for generating the immediately previous bit of the converted multibit digital output signal for generating a fourth and a fifth phase-detected output signal, respectively, representative thereof;

(k) separately comparing each of the fourth and fifth phase-detected output signals with said predetermined reference potential and generating a separate digital output signal having a first binary value when the magnitude of the associated fourth and fifth phase-detected output signal is greater than said reference potential and a second binary value when the magnitude of the associated fourth and fifth phase-detected output signal is less than said reference potential; and (l) generating a separate bit of the converted multibit binary output signal representative of the Exclusive-OR function of the separate digital output signals generated in step (k).

* * * * *